United States Patent [19]
Ovshinsky

[11] 4,177,474

[45] Dec. 4, 1979

[54] HIGH TEMPERATURE AMORPHOUS SEMICONDUCTOR MEMBER AND METHOD OF MAKING THE SAME

[75] Inventor: Stanford R. Ovshinsky, Bloomfield Hills, Mich.

[73] Assignee: Energy Conversion Devices, Inc., Troy, Mich.

[21] Appl. No.: 841,369

[22] Filed: Oct. 12, 1977

Related U.S. Application Data

[63] Continuation-in-part of Ser. No. 797,929, May 18, 1977.

[51] Int. Cl.$^2$ .............................................. H01L 45/00
[52] U.S. Cl. ............................................ 357/2; 357/4; 357/61; 357/63; 252/63.5
[58] Field of Search ........................ 357/2, 4, 5, 61, 63

[56] References Cited

U.S. PATENT DOCUMENTS

| | | | |
|---|---|---|---|
| 3,688,160 | 8/1972 | Nagasawa | 317/238 |
| 3,716,844 | 2/1973 | Brodsky | 340/173 LS |
| 3,864,717 | 2/1975 | Merrin | 357/2 |
| 3,983,542 | 9/1976 | Ovshinsky | 340/173 |

OTHER PUBLICATIONS

Shimakawa, *Japan J. Appl. Phys.*, 10 (1971), pp. 1116–1117.
Petersen, et al., *IEEE Transactions on Electron Devices*, vol. ED-23, No. 4, Apr. 1973, pp. 471–477.
Spear, *Proceed. 5th Int. Conf. on Amorphous Semiconductors*, Partenkirche, Fed. Rep. Germany, Sep. 3–8, 1973.

*Primary Examiner*—Martin H. Edlow
*Attorney, Agent, or Firm*—Wallenstein, Spangenberg, Hattis & Strampel

[57] ABSTRACT

An amorphous semiconductor member which is capable of withstanding high temperatures and of having good toughness characteristics comprises an amorphous semiconductor material including a composition of a plurality elements, at least one of which is a low atomic weight element comprising boron, carbon, nitrogen or oxygen, formed in a solid amorphous host matrix having structural configuration which have local rather than long range order and electronic configurations providing an energy gap and an electrical activation energy. It also includes a modifier material added to the amorphous host matrix, such as a transition metal or rare earth element, having orbitals which interact with the amorphous host matrix and form electronic states in the energy gap which modify substantially the electronic configurations of the amorphous host matrix at room temperature and above. The amorphous semiconductor member may also comprise an amorphous host matrix formed from boron, carbon, silicon or germanium having a modifier material of boron or carbon added thereto. The forming of the amorphous host matrix and the adding of the modifier material is preferably done by cosputtering or the like.

73 Claims, 5 Drawing Figures

HIGH TEMPERATURE AMORPHOUS SEMICONDUCTOR MEMBER AND METHOD OF MAKING THE SAME

This application is a continuation-in-part of application Ser. No. 797,929, filed May 18, 1977, for Amorphous Semiconductor Member and Method of Making the Same.

Briefly, as in said application Ser. No. 797,929, the amorphous semiconductor members of this invention have characteristics superior to those found in crystalline semiconductors, such as doped crystalline silicon, germanium, or the like, and those found in amorphous semiconductors, such as compensated and doped glow discharge amorphous silicon, germanium, or the like, and which have wide applications of usage including current generation devices such as thermoelectric or solar radiation devices, current control devices such as p-n junction devices including diodes, transistors or the like, and many other applications of usage which may be brought into being by utilizing the principles of this invention.

As in said application Ser. No. 797,929, the amorphous semiconductor members of this invention can be made from a plurality of elements, including complex alloys thereof, which can be selected and designed for tailor-making an amorphous matrix having substantially any desired structural configurations and substantially any desired electronic configurations having a desired energy gap and electrical activation energy, to provide the semiconductor members with desired physical, thermal and optical properties, while being capable of having the electronic configurations thereof substantially independently modified for modifying the electrical activation energy to provide the semiconductor members with desired electrical properties. The amorphous semiconductor members are synthetically created, they need not be made from the melt, they need not depend upon stoichiometry, and they are not constrained by crystalline forms or inhibitions. This means that there is a whole new range of material combinations that can be designed to optimize desired material attributes having to do with the physical, chemical, temperature, and electrical properties of the materials.

In accordance with the instant invention, the amorphous semiconductor members are capable of withstanding high temperatures and of having good toughness characteristics and, in this respect, the instant invention is a carrying forward of the invention of the aforementioned application Ser. No. 797,929.

Crystalline semiconductors became practical and formed the foundation of a huge business as well as the basis of a powerful scientific establishment. This was due to the ability to alter substantially intrinsic germanium and particularly silicon crystals into extrinsic materials and to control their being either of a p or n conduction type. This involved substantially pure crystalline materials in which parts per million or so of a dopant were carefully introduced as substitutional impurities into the substantially pure crystalline materials to increase the electrical conductivity thereof and to control their being either of a p or n conduction type. This was done by the achievement of growing individual single crystals under carefully controlled conditions and the doping of such single crystals with extremely small and critical amounts of dopants also under carefully controlled conditions. In such crystalline semiconductors, purity, cleanliness, complex and sophisticated crystal growing and doping techniques became the center of an industry that has made the computer possible, as well as transistorized radios, and the like. This revolution occurred because the scientific basis became well known, it having to do with the introduction into Group IV crystals, such as silicon and germanium, Group III dopant materials, such as boron or the like, as an acceptor, and Group V dopant materials, such as arsenic, or the like, as a donor.

With respect to the aforementioned doped crystalline semiconductors, the procedures in making the same are complex, time consuming, and expensive procedures. Also, the yield in the manufacture of such doped crystalline semiconductors leaves much to be desired. They necessarily have a fixed energy gap determined by the particular crystals utilized. Further, because of the single crystal nature of such semiconductors, they are limited in size and cannot conveniently provide devices with large dimensional or area geometry.

Because of the aforementioned difficulties in such crystalline semiconductors (doped silicon and germanium crystals), the industry attempted to look toward the use of amorphous silicon and germanium semiconductors to replace the crystalline semiconductors. Work in the amorphous material field was discouraging to the practitioners for they were versed particularly in the crystalline material field. While such practitioners came to acknowledge that there might be unique electronic switching and structural memory effects in amorphous materials, the mainstream of semiconducting science and technology was not impacted thereby because the amorphous materials were basically intrinsic and, therefore, it was the belief that transistors or the like could not be successfully made therefrom.

Furthermore, such work was generally unproductive since stable amorphous semiconductors of amorphous silicon or germanium could not be obtained. Amorphous silicon or germanium (Group IV) have microvoids and dangling bonds and are normally four-fold coordinated except for the microvoids and dangling bonds which provide localized states in the energy gap thereof. Such localized states remain in the amorphous silicon or germanium, whether or not doping of the amorphous material is attempted, and they are subject to annealing and other conditions, including deposition conditions and temperature and other ambient conditions, which change their characteristics and which render them sufficiently unstable so as not to be satisfactorily useable as reliable semiconductors, transistors, or the like.

To minimize the aforementioned problems involved with amorphous silicon and germanium, W. E. Spear and P. G. Le Comber of Carnegie Laboratory of Physics, University of Dundee, in Dundee, Scotland, did some work on "Substitutional Doping of Amorphous Silicon," as reported in a paper published in Solid State Communications, Vol. 17, pp. 1193–1196, 1975, toward the end of reducing the localized states in the energy gap in the amorphous silicon or germanium to make the same approximate more closely intrinsic crystalline silicon or germanium and of substitutionally doping said amorphous materials with suitable classic dopants, as in doping crystalline materials, to make them more extrinsic and of p or n conduction types. This was accomplished by glow discharge deposition where in a gas of silane ($SiH_4$) and a gas of phosphine ($PH_3$) for n-type conduction, or a gas of diborane ($B_2H_6$) for p-type conduction, were premixed and passed through a reaction tube where the gaseous mixture was decomposed by an r.f. glow discharge and deposited on a substrate at high substrate temperature of about 500°–500° K. The material so deposited on the substrate is an amorphous material consisting of silicon and up to about 30 percent hydrogen (silicon hydride) and substitutional phosphorus or boron in dopant concentrations between about $5 \times 10^{-6}$ and $10^{-2}$ parts per volume.

As expressed above, amorphous silicon, and also germanium, is normally four-fold coordinated, and normally has microvoids and dangling bonds, producing localized states in the energy gap. The hydrogen in the silane combines with many of the dangling bonds of the silicon during the glow discharge deposition to decrease or minimize the density of the dangling bonds and microvoids in the deposited amorphous material for compensating the local states in the energy gap toward the end of making the amorphous material approximate more nearly the corresponding crystalline material. The dopants, phosphorus from Group V elements for providing n-type conduction, and boron from Group III elements for providing p-type conduction, respectively, obtained from the phosphine and diborane, respectively, were incorporated during the glow discharge deposition into the amorphous deposition in four-fold coordinated manner as a substitutional impurity for silicon in the amorphous material just as in single crystal doping.

While the density of states in the energy gap of the glow discharge amorphous silicon is substantially reduced, particularly at the Fermi level, two bumps of relatively high density states remain in the energy gap which are apparently related to the remaining dangling bond density and they are located substantially at about 0.4 eV below the conduction band $E_c$ and above the valence band $E_v$. When the glow discharge amorphous silicon is doped with phosphorus or boron, the Fermi level is believed to be moved up or down, but an insufficient amount of active sites have been affected to move the Fermi level beyond either of the bumps. Thus, the activation energy for the doped glow discharge amorphous silicon has not been lowered below about 0.2 eV. This result also places a theoretical limitation on the open-circuit photovoltage of a p-n junction of doped glow discharge amorphous silicon, since the internal field cannot exceed the separation of the Fermi level in the p and n type regions. In addition, the remaining activation energy limits the room-temperature D.C. conduction of the doped glow discharge amorphous silicon and the material would have a large sheet resistance if it were made into a large area array, the resistance not being helped by the rather low carrier mobility which is a factor of about $10^5$ less than that for crystalline silicon. As in the case of silicon crystalline semiconductors, the glow discharge amorphous semiconductors utilizing silicon have substantially fixed energy gaps.

The foregoing glow discharge amorphous silicon, which has been compensated by hydrogen to make it more closely resemble crystalline silicon and which has been doped in a manner like that of doping crystalline silicon, all done during the glow discharge deposition, has characteristics which in many respects are inferior to those of doped crystalline silicon and cannot be used successfully in place of doped crystalline silicon. In such glow discharge amorphous silicon there are also problems of poor adhesion to the substrates on which they are deposited and of cracking, and the like.

Instead of attempting to compensate amorphous materials to resemble more closely crystalline materials and doping the same in the manner of doping crystalline materials, as aforesaid, the instant invention and that of said aforementioned application Ser. No. 797,929 have to do with working directly with disordered amorphous materials and considering the differences between the amorphous and crystalline materials rather than the similarities therebetween, with being able to select or manipulate the structural configurations and the energy gap of the electronic configurations of the amorphous materials at will and to manipulate independently the activation energy thereof at will for maximum design optimization, and with a simple technology system which can utilize many elements of the various columns of the periodic table which can be made up in the solid amorphous state. Thus, in accordance with the instant invention and that of the aforementioned application, there are substantially no limitations of crystalline symmetry nor of a single energy gap as was heretofore prevalent.

The principles of this invention and that of the aforementioned application are applicable, among others, to solid amorphous semiconductor matrices, including Group IV elements having normal tetrahedral bonding and three-dimensional stability, Group V elements having normal trivalent bonding and two-dimensional stability (i.e., sheets), and Group VI elements having normal divalent bonding and one-dimensional stability (i.e., chains and rings). Generally speaking, the Group V and VI amorphous materials do not contain microvoids and dangling bonds as do the Group IV amorphous materials and the Group IV amorphous materials do not contain lone pairs as do the Group V and VI amorphous materials. The presence of elements from Groups III or V in the semiconductors containing Group VI elements crosslink the chains thereof, and the presence of elements from Group IV in the semiconductors containing Group V or VI elements crosslink either the sheets of Group V or the chains and rings of Group VI, so that three-dimensional stability can be accomplished in the amorphous semiconductors containing the Groups V and VI elements. The amophous semiconductor matrix involved in this invention and that of the aforementioned application can include combinations and complex alloys including the aforementioned elements and materials to tailor-make the energy gap for desired physical, thermal and optical purposes while being capable of independently modifying and controlling the electrical activation energy for electrical purposes.

Briefly, in accordance with this invention, and that of the aforementioned application Ser. No. 797,929, an amorphous semiconductor material is formed in a solid amorphous matrix having structural configurations which have local rather than long-range order and electronic configurations which have an energy gap and an electrical activation energy. The solid amorphous matrix of the amorphous semiconductor material may be formed, for example, as a layer or film deposited on a substrate by sputtering or the like at various temperatures, preferably below the crystalline or glass transition temperatures thereof, the structural configurations and the electronic configurations being frozen in and being in at least a quasi-equilibrium condition. While the amorphous semiconductor materials have many bonding options, the bonding of the amorphous semiconductor material, including the elements thereof, into the solid amorphous matrix can be primarily by covalent bonding, which is responsible for the strong bonds, so as to substantially maintain its integrity and its energy gap. As used herein, the normal structural bonding (NSB), which characterizes conventionally prepared amorphous materials, is the condition where each atom forms the optimal number of bonds, such as covalent bonds, primarily responsible for the cohesive energy of the amorphous solid. The energy gap —E(eV)— is the difference in energy between the states at the top of the valence band and the bottom of the conduction band. It is normally measured optically and is often referred to as the optical band gap. The energy gap is basically determined by the solid amorphous semiconductor materials forming the amorphous matrix and the structural configurations thereof.

A solid amorphous semiconductor material can have a wide spectrum of localized states in the energy gap, including bonding and nonbonding states, which are herein referred to as deviant or defect electronic configurations (DECs) and which have an effect upon the Fermi level and the electrical activation energy of the semiconductor material. Such defect electronic configurations can include substitutional impurities and vacancies, interstitials, dislocations, and so forth, which occur principally in crystalline solids because of periodic restraints therein. In solid amorphous materials, three-dimensional orbital relationships can occur which are generally prohibited in crystalline materials by reason of the periodic constraints in the latter. Other defect electronic configurations, particularly in the amorphous semiconductor materials here involved, can include microvoids and dangling bonds, dangling bond and nearest neighbor interactions, lone pairs, lone-pair/lone-pair interactions, lone pair and nearest neighbor interactions, valence alternation pairs, dative or coordinate bonds, charge compensation, polyvalency, lone-pair compensation, hybridization, three-center bonding, $\pi$ bonding, complexing, and others, all of which operate toward pinning and affecting the Fermi level in the energy gap of the materials and control the conduction process of the semiconductor materials.

The localized states in the energy gap and the electrical activation energy are related to the structural configuration of the amorphous matrix, to the nearest neighbor relationships of the elements in the amorphous matrix, to the aforementioned defect electronic configurations, and to electrically active centers in the amorphous matrix. The electrical activation energy —$E_\sigma$—(eV)— is the energy difference between the Fermi level and the nearest band edge (valence band or conduction band) and without modification corresponds generally to one-half the energy gap.

Also briefly, in accordance with this invention, and that of the aforementioned application Ser. No. 797,929, a modifier material is added to the aforementioned solid amorphous matrix of the amorphous semiconductor material for modifying the electronic configurations thereof by forming electronic states in the energy gap, and which can change and rearrange the localized states in the energy gap. As a result, the Fermi level of the energy gap may be unpinned and shifted and the electrical activation energy of the amorphous matrix may be changed substantially for changing substantially the electrical conductivity substantially at room temperature and above. The modifier material added to the amorphous matrix can be in amounts greater than dopant amounts usually used for doping crystalline semiconductors or for doping the aforementioned glow discharge amorphous silicon, and may be in amounts up to about 35 percent by volume. The modifier material is not merely a dopant but, instead, a true modifier which modifies the electronic configurations of the amorphous matrix (including the localized states) and the electrical activation energy thereof.

The modifier material may be added to the amorphous matrix by codeposition of the modifier material and the semiconductor material onto a substrate which need not be hot but which can be relatively cool. Therefore, the modifier material, preferably, may be added at a temperature below the crystallization or glass transition temperature or at a temperature below the melting temperature of the semiconductor material during the formation of the amorphous matrix. The codeposition of the modifier material and the amorphous semiconductor material may be accomplished, for example, by cosputtering or the like the materials simultaneously onto the substrate, with the result that the modifier material is added to the amorphous semiconductor material as the solid amorphous matrix is being formed, and importantly is not predicated on doping substitutionality.

The techniques of forming the solid amorphous semiconductor matrix and adding the modifier material thereto, as discussed above, are disclosed and claimed in a joint patent application in which the inventor of the instant application is a joint inventor.

If the modifier material were introduced into the bulk of the semiconductor material at temperatures above the glass transition temperatures or the melting temperatures thereof, it would probably be incorporated in the amorphous matrix as a substitutional element in the amorphous matrix, as by covalent bonding or the like, resulting in an intrinsic structure. The electrical changes would then not be as substantial as the changes in the electrical activation energy provided for in the instant invention and that of the aforementioned application. Instead, the modifier material is added to the amorphous matrix of the amorphous semiconductor material at temperatures below the glass transition temperature or the melting temperature of the amorphous matrix so that the amorphous matrix remains substantially intact, and minimal, if any, change occurs in the structural configuration of the amorphous matrix and in the energy gap of the electronic configuration thereof when the modifier is so added. While the modifier material is preferably introduced into the amorphous matrix while the latter is in at least a quasi-equilibrium condition, the amorphous matrix may be placed in a non-equilibrium condition, as by the application of an electric field or radiant energy thereto, when the modifier material is added thereto, to produce variant modifications in the electronic configuration of the amorphous matrix.

The modifier material added to the amorphous matrix of the amorphous semiconductor material may be positioned and held in position by various physical and chemical means, as for example, by coulombic forces, or with bonding thereto by a wide spectrum of bonding, as for example, including covalent bonding, dative or coordinate bonding, interaction of the orbitals of the modifier material with the amorphous matrix, or the like, and various combinations thereof.

When the modifier material is added to the solid amorphous matrix in accordance with the foregoing, it sees many different sites therein, including, among others, nearest neighbor relationships, element spacings, bond angles and strengths, charged and localized states in the band gap, microvoids, dangling bonds, lone pairs, and the like, which it would not see if introduced in the bulk or above the glass transition temperature or melting temperature of the amorphous material, and the modifier material can seek out these sites and readily modify the electronic configuration of the amorphous matrix by forming desired electronic states in the energy gap thereof (and which can also modify the localized states in the energy gap) for changing the activation energy thereof. Where the amorphous matrix initially has localized states, microvoids, dangling bonds, lone pairs, or the like, the modifier material added to the amorphous matrix can also, at least in part, deactivate the same in addition to forming new electronic states.

The modifier material added to the amorphous host matrix has orbitals which interact with the amorphous host matrix and form electronic states in the energy gap which modify substantially the electronic configurations of the amorphous host matrix for changing substantially the electrical activation energy thereof. The modifier material may comprise elements which have sp orbitals, transition metals, as for example, nickel, tungsten, vanadium, copper, zinc, molybdenum, rhodium, or iron, which have d orbitals, and rare earth elements, as for example, gadolinium or erbium, which have d and f orbitals. The transition metals having d orbitals, which at least atomically are not full, are generally preferred since such d orbitals thereof have a greater spectrum of interaction possibilities with the amorphous host matrix than the elements having sp orbitals. The amorphous host matrix may be formed from an amorphous semiconductor material, including elements selected from Group VI of the periodic table, as for example, tellurium, selenium, sulphur, or oxygen, and Group V of the periodic table, such as, arsenic, phosphorous or nitrogen, from Group IV of the periodic table, as for example, silicon, germanium and/or carbon, or from Groups III and V, or from Groups II and VI of the periodic table, and from boron of Group III of the periodic table with or without carbon. By appropriate selection of these elements and the relative amounts of the selected elements, or by utilizing additional elements in the amorphous matrix, the structural configuration may be selected or designed to provide the electronic configurations with substantially any desired energy gap. Thus, the amorphous matrix of such solid amorphous semiconductor materials may be tailored to provide desired energy gaps therein.

Modifier materials, such as the transition metal elements including, for example, nickel, tungsten, molybdenum, iron, vanadium, rhodium, zinc or copper, having d orbitals, and the rare earth elements including, for example, gadolinium or erbium, having d and f orbitals may be readily added to the amorphous matrix of the solid amorphous semiconductor materials, by cosputtering or the like, in the manners discussed above with exceptional results being obtained, particularly with the Groups III and IV elements and the transition metals.

The addition of these modifier materials to the amorphous matrix primarily does not affect the structural bonds of the structural configurations of the amorphous matrix or the energy gap thereof in any substantial manner, even though some of the modifier material may be incorporated in the structural bonds. However, they do affect the localized states or the electrically active centers in the energy gap and the electrical activation energy of the electronic configurations to a substantial degree for transforming the amorphous matrix from an intrinsic semiconductor to an extrinsic semiconductor. In this connection, the modifier material interacts with the solid amorphous materials of the amorphous matrix to form electronic states or electrically active centers and much of this involves the interaction of the orbitals of the modifier material with the amorphous matrix. Thus, the addition of the modifier materials to the amorphous semiconductor materials in the amorphous matrix can have a minimal effect on the structural configurations and energy gap, but can have a spectrum of effects from subtle to drastic upon the electronic configurations and the activation energy.

The electronic states or electrically active centers so produced involve the production of electrically charged centers. At the same time, any localized states or electrically active centers which may be present in the amorphous matrix, as may be caused by deviant or defect electronic configurations (DECs), can be substantially deactivated so that the electronic states or electronically active centers provided by the modifier material essentially determine the electronic states in the energy gap and the electrical activation energy. The density of localized states or electrically active centers in the amorphous matrix of the amorphous semiconductor material is substantially altered by the modifier material added thereto and substantially no bumps of relatively high density remain in the energy gap between the Fermi level and the conduction band or valence band, as in the glow discharge amorphous silicon, as discussed above. As a result, the Fermi level may be shifted in appreciably greater degrees in the energy gap toward the conduction or the valence bands by the modifier material to provide appreciably greater changes in the electrical activation energy. The amount of modifier material added to the amorphous matrix determines the amount of modification of the localized states and formation of electronic states in the energy gap and the amount of change in the electrical activation energy. Thus, the electronic states in the energy gap and the electrical activation energy may also be predetermined and tailored to fit desired electrical characteristics.

In the primarily lone-pair amorphous semiconductor materials including the Group V and Group VI elements, the electronic configurations thereof are comprised primarily with lone-pairs and their interactions with their nearest neighbors and these materials are generally compensated structurally to be intrinsic and are considered "ideal" amorphous materials since they have few, if any, dangling bonds and no microvoids, they being spin compensated. The lone-pairs and their interactions with their nearest neighbors form orbitals or defect electronic configurations and the added modifier material interacts with the same in the amorphous matrix to alter the same and to form electronic states or electrically active centers in the energy gap, and much of this involves the interaction of the orbitals of the modifier material with such defect electronic configurations in the amorphous matrix.

In the primarily tetrahedral bonding amorphous semiconductor materials including the Group IV elements, the localized states or electrically active centers in the energy gap include, among others, orbitals or defect electronic configurations such as nontetrahedral bonding and dangling bonds, and, here, the modifier material acts with such materials in the amorphous matrix to alter the localized states and to form new electronic states or electrically active centers in the energy gap, and much of this involves the interaction of the orbitals of the modifier material with the defect electronic configurations and dangling bonds of the amorphous matrix.

In the amorphous semiconductor material containing boron of Group III, the localized states or the electrically active centers in the energy gap include, among others, orbitals or three-centered bonding, in which two electrons are shared by three atoms in a single covalent bond and yielding non-bonding states which are ordinarily empty and, in a sense, are reversed analogs of lone-pair states. Here, the modifier material interacts with such semiconductor material in the amorphous matrix to form new electronic states or electrically active centers in the energy gap, and much of this involves the interactions of the orbitals of the modifier material with the three-centered and other bonding in the amorphous matrix. Boron, because of its three-centered bonding, can itself be utilized as a modifier material for another host matrix material, such as, carbon, silicon, germanium, or the like.

The orbitals of the modifier material interact with the localized states or electrically active centers in the energy gap of the amorphous host matrix material to modify the electronic configurations of the amorphous host matrix. In accordance with the principles of this invention, the amorphous semiconductor member of this invention may be designed or tailor-made to provide the same with desired physical and electrical properties, as for example, the energy gap (band gap) E(eV), the electrical conductivity at room temperature $\sigma_{RT}$ $(\Omega cm)^{-1}$, the electrical activation energy $E_\sigma$ (eV), the Seebeck coefficient S(V/°C.), the conduction type either p or n, with desired thermal conductivity. By appropriate parameter design of the Seebeck coefficient and the electrical conductivity (which should be relatively high), and of the thermal conductivity (which should be relatively low) efficient thermoelectric generation devices may be readily fabricated. In some of the amorphous semiconductor members of this invention, the addition of the modifier material to the amorphous host matrix may not change the normal conduction type (p or n) thereof, but in others it may change the same to the opposite conduction type, especially where an appreciable amount of modifier material is added. It is, therefore, possible to utilize the principles of this invention to provide p-n junction type devices for current control purposes and the like.

The principal object of this invention is to provide amorphous semiconductor members which are capable of withstanding high temperatures and of having good toughness characteristics so that they are operable at room temperatures and considerably above, as for example, up to about 600° C. or more and can stand the physical rigors of commercial use.

Briefly, one form of the amorphous semiconductor member of this invention can comprise an amorphous semiconductor material including a composition of a plurality of elements, at least one of which is a low atomic weight element comprising boron, carbon, nitrogen or oxygen, or of boron or carbon, formed in a solid amorphous host matrix having structural configurations which have local rather than long range order and electronic configurations providing an energy gap and an electrical activation energy. It also inlcudes a modifier material added to the amorphous matrix and having orbitals which interact with the amorphous host matrix and form electronic states in the energy gap which modify substantially the electronic configurations of the amorphous host matrix at room temperature and above.

The amorphous host matrix of the amorphous semiconductor material can be normally of intrinsic-like conduction and the modifier material added to the amorphous host matrix can change the same to extrinsic-like conduction. The modifier material added to the amorphous host matrix can change substantially the electrical activation energy thereof and, hence, change substantially the electrical conductivity of the semiconductor member at room temperature and above. It can also change substantially the Seebeck coefficient of the semiconductor member and/or the conductivity type thereof.

The composition of the amorphous semiconductor material of the amorphous host matrix can also comprise at least two of said elements of low atomic weight. Examples of the amorphous semiconductor materials forming the amorphous host matrix may comprise, among others, boron (B), carbon (C), boron and nitrogen (BN), boron and carbon ($B_4C$), silicon and nitrogen ($Si_3N_4$), silicon and carbon (SiC), silicon and oxygen ($SiO_2$), tellurium and oxygen ($TeO_2$), or the like. The modifier material, for example, can comprise a transition metal, a rare earth element, or the like, as set forth above, and, also, carbon or boron used, respectively, with a boron or carbon amorphous host matrix.

Since the amorphous semiconductor material of the amorphous host matrix includes elements which are of low atomic weight (light elements), it can withstand high temperatures and be operable at room temperatures and considerably above, for example, up to about 600° C. and more, and this is particularly true where the amorphous host matrix comprises a composition of a plurality of said low atomic weight elements. Also, where the amorphous host matrix includes elements of low atomic weight (light elements), the amorphous semiconductor member has substantial structural rigidity and good toughness characteristics and this is particularly so where the amorphous host matrix comprises a composition of a plurality of said low atomic weight elements, rather than a single element.

In this respect, the aforementioned low atomic weight elements (light elements) in the amorphous host matrix provide strong bonding forces therein, principally by covalent bonding, and high melting point temperatures with corresponding high crystalline and glass transition temperatures. Crystalline forces operate to tend to change amorphous structures to crystalline structures but this requires mobility of atoms and movement thereof from the amorphous state to the crystalline state which principally occurs at the crystalline and the glass transition temperatures of the amorphous structure. The strong bonding forces and the high melting and corresponding high crystalline and glass transition temperatures of the amorphous host matrix of this invention, including low atomic weight elements, minimize mobility of the atoms thereof so that the amorphous host matrix can withstand high temperatures and have good toughness characteristics and maintain its amorphous state.

Another form of the amorphous semiconductor member of this invention comprises an amorphous semiconductor material, which is primarily tetrahedral bonding and comprises, for example, silicon or germanium, and which is formed in a solid amorphous host matrix having structural configurations which have local rather than long range order and electronic configurations providing an energy gap and an electrical activation energy. It also includes a modifier material added to said amorphous matrix, primarily in a nonsubstitutional manner and can be in amounts greater than dopant amounts, and comprising a low atomic weight element, including, for example, boron or carbon, and having orbitals which interact with the amorphous host matrix and form electronic states in the energy gap which modify substantially the electronic configurations of the amorphous host matrix at room temperature and above.

Also, in this form of the invention, the amorphous host matrix of the amorphous semiconductor material can be normally of intrinsic-like conduction and the modifier material added to the amorphous host matrix can change the same to extrinsiclike conduction. The modifier material added to the amorphous host matrix can change substantially the electrical activation energy thereof and, hence, change substantially the electrical conductivity of the semiconductor member at room temperature and above. It can also change substantially the Seeback coefficient of the semiconductor member and/or the conductivity type thereof. Since the modifier material added to the amorphous host matrix includes elements which are of low atomic weight (light elements), the resulting modified semiconductor element can also withstand high temperatures and be operable at room temperatures and considerably above, and can also have good toughness characteristics.

Further objections of this invention reside in the components of the amorphous semiconductor member and the relationships between the components and in the method of making the amorphous semiconductor member.

Other objects and advantages of this invention will become apparent to those skilled in the art upon reference to the accompanying specification, claims and drawings in which:

Figure 1:
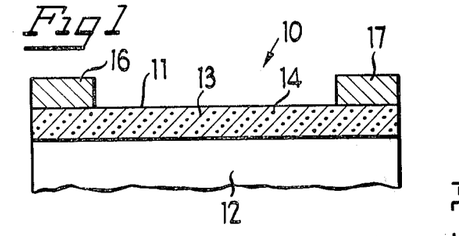
FIG. 1 is a diagrammatic illustration of one form of a semiconductor device of this invention.

Referring first to FIG. 1, one form of a semiconductor device of this invention is generally designated at 10. It incude an amorphous semiconductor member 11, which is deposited on a substrate 12, preferably formed of an insulating material such as glass, or the like. The amorphous semiconductor member 11 includes an amorphous semiconductor material 13 which is formed in a solid amorphous host matrix having structural configurations which have local rather than long-range order, and electronic configurations which have an energy gap and a large electrical activation energy. The amorphous semiconductor member 11 also includes a modifier material 14 which is added to the amorphous matrix and which is substantially homogeneously incorporated in the amorphous semiconductor material 13. The amorphous semiconductor member can also include electrodes 16 and 17 applied thereto for purposes of electrical connections thereto.

Preferably, the amorphous semiconductor member 11 is formed by a codeposition of the amorphous semiconductor material and the modifier material, such as, by cosputtering or the like. Cosputtering can be accomplished in a conventional r.f. sputtering system such as made and sold by R. D. Mathis Co. Here, a cathode or target is bonded to a standard aluminum backing plate and is made of the semiconductor material to be deposited on the substrate 12. Also, pieces of the modifier material are secured on the semiconductor material of the target. The substrates 12 are carried by a holder located from the target by a distance of about 3.5 cm for a $3\frac{1}{2}"$ diameter cathode, and at a distance of about 3 cm for a 1" diameter cathode.

The sputtering machine is first evacuated to a vacuum pressure somewhat less than about $6 \times 10^{-6}$ Torr to provide a background vacuum pressure. Argon is bled into the machine to provide an operating pressure of about $5 \times 10^{-3}$ Torr as determined by a reading on a Pirani vacuum gauge, giving an actual vacuum pressure of about $7 \times 10^{-3}$ Torr in the machine. The surface of the cathode or target and pieces of modifier material are first cleaned by sputtering against the shutter of the machine adjacent to the substrates for about 30 minutes. Thereafter, the shutter is opened and the semiconductor material of the target and the pieces of modifier material on the target are cosputtered onto the substrates. The cathode or target and the holder for the substrates are both water cooled so that the temperatures thereof are low during the sputtering operation, below the melting or crystalline or glass transition temperatures of the materials. The r.f. power of the machine may have a frequency of about 13.56 MegaHertz, and about 1000 Volts of forward power, about 50–70 Watts being utilized for a 3.5" diameter cathode or target.

The deposition rates depend on the materials being sputtered, and the time of deposition is varied to obtain desired thicknesses of the deposit. The thicknesses of the simultaneously deposited amorphous semiconductor member having the modifier therein may vary from a few 100Å to about 5$\mu$, depending upon the uses to which the amorphous semiconductor member is to be put. The semiconductor material and the modifier material are deposited on the substrates in amorphous form.

The amount of modifier material substantially homogeneously added to the amorphous semiconductor material in forming the amorphous semiconductor member is generally determined by the area of the pieces of the modifier material applied to the semiconductor material of the cathode or target. Desired percents of modifier material added to the amorphous semiconductor material may accordingly be conveniently controlled. As an example, to obtain an amorphous semiconductor member having a thickness of about 1000Å and composed of SiC having molybednum as a modifier, takes sputtering for about seven minutes from a $3\frac{1}{2}"$ cathode. By utilizing cosputtering as generally here described, the modifier material 14 is substantially homogeneously added to the semiconductor member 11 to provide the beneficial features of this invention, as discussed above. The deposited semiconductor may be annealed, if desired.

As shown in FIG. 1, the electrodes 16 and 17 are placed in spaced apart points along the amorphous semiconductor member 11 so as to be subject to the electrical characteristics along the length of the semiconductor member 11. As for example, the device 10 of FIG. 1 can be a thermoelectric generator device so that when one end of the device is heated to have a higher temperature than the other end thereof, thermoelectric power is developed in the semiconductor member with the power being taken off at the spaced electrodes 16 and 17.

Figure 2:
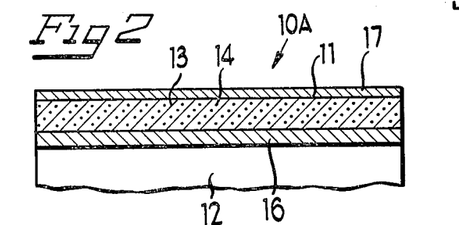
FIG. 2 is a diagrammatic illustration of another form of a semiconductor device of this invention.

Another form of the invention is designated at 10A in FIG. 2 and it differs from the device 10 of FIG. 1 in that the electrodes 16 and 17 are on opposite sides of the amorphous semiconductor member 11 so as to respond to the electrical characteristics of the amorphous semiconductor member 11 through the thickness thereof as distinguished from through the length thereof. In this connection, a metallic electrode 16 is first deposited on the substrate 12 before the amorphous semiconductor member 11 is deposited. The amorphous semiconductor member 11, including the amorphous semiconductor matrix 13 with the modifier material 14 homogeneously added thereto, may be formed and deposited in the same manner as the amorphous semiconductor member 11 of FIG. 3. The amorphous semiconductor member 11 may be formed by cosputtering as discussed above.

After the amorphous semiconductor member 11 is formed, a metal electrode 17 is deposited thereover as illustrated in FIG. 2. As one example, the amorphous semiconductor device 10A of FIG. 10 may be utilized as a thermoelectric generator device by heating the electrode 17 to a temperature above that of the electrode 16 for generating thermoelectric power in the amorphous semiconductor member 11 thereacross, the electrodes 16 and 17 being utilized for taking off the thermoelectric power. As another example, the metal electrode 17 may be a transparent metal so as to pass light therethrough. The transparent electrode 17 is such with respect to the semiconductor member as to provide a Schottky barrier between it and the semiconductor member 11. Light, such as solar energy, can generate photoelectrically, at the Schottky barrier, voltage and current which can be taken off by the electrodes 16 and 17.

Figure 3:
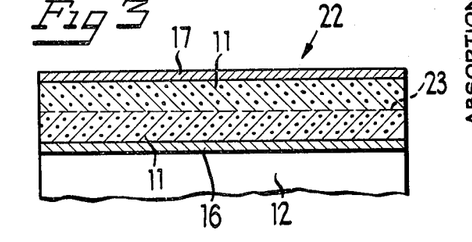
FIG. 3 is a diagrammatic illustration of a p-n junction type device utilizing the amorphous semiconductor members of this invention.

The amorphous semiconductor members 11 may be of the p or n conduction types and, as illustrated in FIG. 3, a device generally designated at 22 includes two layers of amorphous semiconductor members 11, one of which is p type and the other of which is n type. These two layers 11 form between them a p-n junction designated at 23. The device 22, therefore, can comprise a p-n junction type device for current controlling purposes, or the like.

Figure 5:
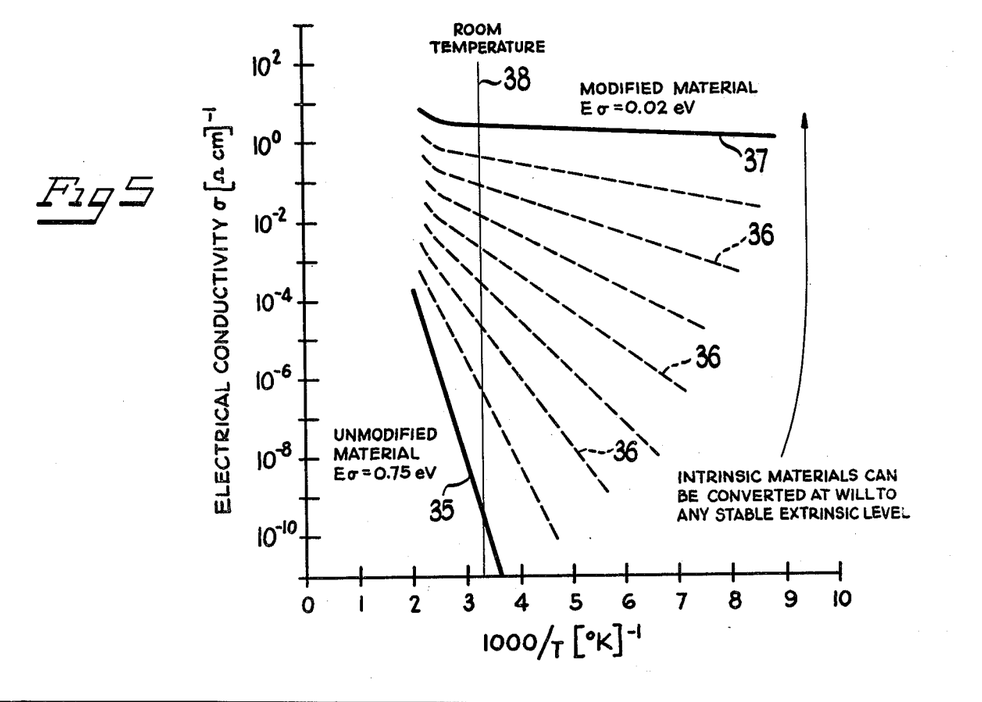
FIG. 5 sets forth a series of illustrative and stylized curves plotting electrical conductivity against inverse temperature and illustrating the activation energy of the unmodified material and the modified material with various degrees of modification.

The illustrative and stylized curves of FIG. 5 graphically point up one of the major features of this invention, the curves plotting electrical conductivity $\sigma[\Omega cm]^{-1}$ against inverse temperature $1000/T[°K]^{-1}$. The unmodified amorphous semiconductor material in the amorphous host matrix has electrical configurations which have an energy gap $E_{04}$ and a large electrical activation energy $E_\sigma$ and since such unmodified material is intrinsic, its electrical activation energy $E_\sigma$ is substantially one-half the energy gap $E_{04}$. Here, for example, the energy gap is 1.5 and the electrical activation energy $E_\sigma$ is 0.75 eV as shown by curve 35. When modifier material is added to the amorphous semiconductor material, the intrinsic unmodified semiconductor material is converted or changed at will to an extrinsic material to stable extrinsic levels as shown by the dotted curves 36 in FIG. 5 depending upon the amount of addition of the modified material, with a corresponding decrease in electrical activation energy $E_\sigma$ until, for example, an electrical activation energy $E_\sigma$ of 0.02 eV is reached as indicated by the curve 37 in FIG. 5. With these stable extrinsic levels, the electrical conductivity at room temperature (and above) $\sigma_{RT}[\Omega cm]^{-1}$ is correspondingly increased as shown by the intersection of the room temperature line 38 with the curves 35, 36 and 37 in FIG. 5. Thus, the unmodified amorphous semiconductor material, which is basically intrinsic, by the addition of selected amounts of modifier material, can be converted at will to a material, which is basically extrinsic, and having stable extrinsic levels at room temperature and above having desired electrical activation energies $E_\sigma$ which are decreased and desired electrical conductivities $\sigma_{RT}$ which are increased in accordance with the amount of modifier material added to the amorphous semiconductor material. A wide design range of activation energy and electrical conductivity can be engineered into the amorphous semiconductor member to meet desired electrical parameters.

Figure 4:
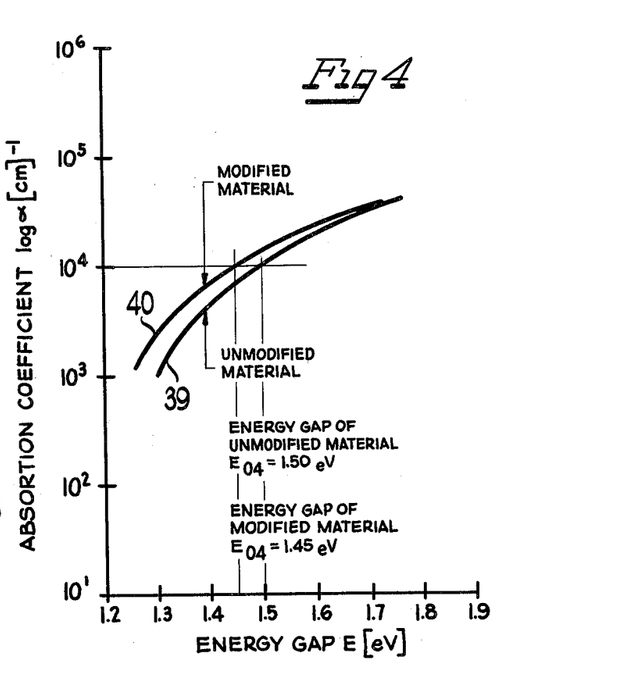
FIG. 4 sets forth illustrative and stylized curves plotting absorption coefficient against energy gap and illustrating the minor differences between the energy gap of the unmodified amorphous semiconductor material and the energy gap of the modified amorphous semiconductor material.

The illustrative and stylized curves of FIG. 4 graphically point up another of the major features of this invention, the curves plotting absorption coefficient log $\alpha[cm]^{-1}$ against energy gap E [eV]. The energy gap $E_{04}$ equals the energy at which the absorption coefficient of the amorphous semiconductor member is $10^4[cm]^{-1}$. For the unmodified semiconductor material as considered in connection with curve 35 of FIG. 5, the energy gap $E_{04}$ is substantially 1.50 eV, as shown by curve 39 of FIG. 4, and for a modified semiconductor material as considered in connection with curve 37 of FIG. 5, the energy gap $E_{04}$ is substantially 1.45 eV, as shown by the curve 40 of FIG. 4. Thus, it is seen that there can be very little difference in the energy gaps $E_{04}$ between the unmodified semiconductor material and the modified material even though there is considerable difference between the activation energies $E_\sigma$ and the electrical conductivity $\sigma_{RT}$ thereof. This is probably due to the fact that the addition of the modifier material to the amorphous semiconductor material has little effect upon the structural configurations of the amorphous semiconductor matrix and the energy gap of the electrical configurations thereof. Thus, while a wide design range of activation energy and electrical conductivity can be engineered into the amorphous semiconductor member, this can be done without materially changing the structural configurations and the energy gap of the amorphous semiconductor material, which is important in connection with preserving the physical properties thereof, including thermal and optical properties. In some instances of the amorphous semiconductor member of this invention, the curves 39 and 40 of FIG. 14 may deviate considerably from those shown but this is unimportant if there is no need for preserving the physical properties of the unmodified semiconductor material.

As stated above, there is a wide design range for the structural configurations and the energy (band) gap $E_{04}$ (eV) of the amorphous semiconductor members and this can be brought about by appropriate selection of the amorphous semiconductor materials. As an example, the following amorphous semiconductor materials can have approximately the following energy gaps $E_{04}$: Si-1.5; SiC-2.06; $B_4C$-3.0; and the like. These amorphous semiconductors can also be modified with modifier materials to provide extrinsic conduction and desired activation energies $E_\sigma$ and electrical conductivities at room temperature (and above) $\sigma_{RT}$.

The low atomic weight elements boron, carbon, nitrogen and oxygen alone, in combination with each other and in combination with other elements have high melting point temperatures $T_M(°C.)$ and correspondingly high crystallization and glass transition temperatures, and, also, high bonding strengths $E_B$ (eV) which can provide amorphous semiconductor members which are capable of withstanding high temperatures and of having good toughness characteristics, as expressed above, and some examples thereof are set forth approximately as follows:

| Material | $T_M$ | $E_B$ |
|---|---|---|
| B | 2300 | 67 |
| C | 3600 | 144 |
| Si | 1410 | 76 |
| $B_4C$ | 2500 | 111 |
| BN | 3000 | 115 |
| SiC | 2700 | 121 |
| $Si_3N_4$ | 1900 | 111 |
| $SiO_2$ | 1610 | 112 |
| $TeO_2$ | 733 | 80 |

It is noted generally that when a low atomic weight element is deposited in combination with another element, the combinations of elements have higher melting temperatures and higher bonding forces than those of such other elements.

The amorphous semiconductor members comprising the amorphous host matrix of amorphous semiconductor material and the modifier material added thereto by cosputtering or the like, for example, may comprise C+B, B+C, B+W, $B_4C$+W, BN+W, SiC+W, $Si_3N_4$+W, $SiO_2$+W, $SiO_2$+C, $TeO_2$+Ni, Si+B, Si+C and the like. The modifier materials modify substantially the electronic configurations of the amorphous host matrix at room temperature and above. The following are some illustrative examples setting forth available information with respect to the physical and electrical properties thereof, including energy gap (band gap) $E_{04}$ (eV), electrical activation energy $E_\sigma$ (eV), electrical conductivity at room temperature $\sigma_{RT}(\Omega cm)^{-1}$, Seebeck coefficient S(V/°C.), and conductivity type p or n.

I. Amorphous semiconductor material of boron and carbon ($B_4C$) and the added modifier material of tungsten (W) cosputtered as above, with the following properties.

|  | $E_{04}$ | $E_\sigma$ | $\sigma_{RT}$ | S | Type |
|---|---|---|---|---|---|
| $B_4C$ | 3.00 | 0.2 | $10^{-6}$ | +1500 | p |
| +2%W |  | 0.122 | $3 \times 10^{-6}$ | +232 | p |
| +7%W | 2.43 | 0.04 | $7 \times 10^{-1}$ | +36 | p |

It is noted that the energy gap does not decrease appreciably, the activation energy decreases substantially, the electrical conductivity increases substantially, the Seebeck coefficient changes substantially and the conductivity type remains p.

II. Amorphous semiconductor material of boron and nitrogen (BN) and the added modifier material of tungsten (W) cosputtered as above, with the following properties.

|  | $E_\sigma$ | $\sigma_{RT}$ |
|---|---|---|
| BN | 0.38 | $3 \times 10^{-11}$ |
| +W | 0.192 | $5 \times 10^{-8}$ |

It is noted that the activation energy descreases substantially and the electrical conductivity increases substantially.

III. Amorphous semiconductor material of silicon and carbon (SiC) and the added modifier material of tungsten (W) cosputtered as above, with the following properties.

|  | $E_{04}$ | $E_\sigma$ | $\sigma_{RT}$ | S | Type |
|---|---|---|---|---|---|
| SiC | 2.06 | 0.19 | $10^{-4}$ | +100 | p |
| +W0.1% | 2.0 | 0.20 | $2 \times 10^{-4}$ | +74 | p |
| +W0.2% | 2.0 | 0.19 | $7 \times 10^{-4}$ | +70 | p |
| +W1.0% | 1.8 | 0.19 | $2 \times 10^{-3}$ | +50 | p |
| +W4.0% | 1.65 | 0.132 | $8 \times 10^{-2}$ | +22 | p |
| +W10.0% | 1.00 | 0.05 | $5 \times 10^{0}$ | +8 | p |
| +W20.0% | 1.00 | 0.028 | 16 | 0 | p |

It is noted that the energy gap does not decrease appreciably until a substantial amount of tungsten is added, the electrical activation energy does not decrease substantially until a substantial amount of tungsten is added, the electrical conductivity increases substantially, the Seebeck coefficient changes substantially and the conductivity type remains p.

IV. Amorphous semiconductor material of silicon and nitrogen ($Si_3N_4$) and the added modifier material of tungsten (W) cosputtered as above, with the following properties.

|  | $E_\sigma$ | $\sigma_{RT}$ |
|---|---|---|
| $Si_3N_4$ | 0.72 | $10^{-14}$ |
| +W | 0.072 | $1.5 \times 10^{-2}$ |

It is noted that the electrical activation energy decreases substantially and the electrical conductivity increases substantially.

V. Amorphous semiconductor material of silicon and oxygen ($SiO_2$) and the added modifier material of tungsten (W) cosputtered as above, with the following properties.

|  | $E_\sigma$ | $\sigma_{RT}$ |
|---|---|---|
| $SiO_2$ | 0.792 | $10^{-13}$ |
| +W | 0.383 | $3 \times 10^{-9}$ |

It is noted that there is a substantial decrease in electrical activation energy and a substantial increase in electrical conductivity.

VI. Amorphous semiconductor material of tellurium and oxygen ($TeO_2$) and the added modifier material of nickel (Ni) cosputtered as above, with the following properties.

|  | $E_\sigma$ | $\sigma_{RT}$ | S | Type |
|---|---|---|---|---|
| $TeO_2$ +Ni | 0.63 | $5 \times 10^{-9}$ | +1900 | p |

It is noted that the electrical activation energy is relatively low, the electrical conductivity is relatively high, the Seebeck coefficient is relatively high and the conductivity type is p.

VII. Amorphous semiconductor material of silicon (Si) and the added modifier material of boron (B) cosputtered as above, with the following properties.

|       | $E_{04}$ | $R_\sigma$ | $\sigma_{RT}$ | S | Type |
|-------|------|------|------|------|------|
| Si    | 1.5  | 0.33 | $10^{-7}$ | −2000 | n |
| +B2%  | 1.35 | 0.21 | $2 \times 10^{-3}$ | +740 | p |
| +B2.5%| 0.2  | $9 \times 10^{-3}$ |  | +48 | p |

It is noted that the energy gap does not decrease appreciably, the electrical activation energy decreases somewhat, the electrical conductivity increases substantially, the Seebeck coefficient changes substantially, and the conductivity type changes from n to p.

VIII. Amorphous semiconductor material of silicon (Si) and the added modifier material of carbon (C) cosputtered as above, with the following properties.

|       | $E_{04}$ | $E_\sigma$ | $\sigma_{RT}$ | S | Type |
|-------|------|-------|------|-------|------|
| Si    | 1.5  | 0.33  | $10^{-7}$ | −2000 | n |
| +C10% |      | 0.162 | $10^{-4}$ |  |  |

It is noted that the electrical activation energy decreases appreciably and the electrical conductivity increases substantially.

In view of the foregoing illustrative examples, it is seen that the amorphous semiconductor members of this invention can be readily designed or tailor-made to provide the same with desired physical and electrical properties for the fabrication of many different devices for many different applications of usage. Substitutional doping is made possible in tetrahedral materials by providing almost all of the nearest-neighbor sites local environments of the tetrahedral type. This is true in both the crystalline material and the glow discharge amorphous silicon. The present invention allows for far more nearest-neighbor bonding choices. This is a more normal result of amorphicity. The great number of these varied orbital and bonding relationships make irrelevant the substitution of one atom into a regularly spaced matrix. What is required is to take into account the multibonding possibilities and utilize them by modification to control conductivity. Not only is boron a good example of the multiorbital possibilities in the amorphous phase, but also the carbon atom, just as it does in organic materials, offers these multiorbital interactions with other inorganic materials. Therefore, it is the nonprimary bonding which is the important aspect of this invention. Not only are the Groups III, IV, V and VI elements important, but the top row thereof, including boron and carbon, can also be important as bond matrices and modifiers by virtue of the differing bonding possibilities they offer. By utilizing elements of the top row, including boron, carbon, nitrogen and/or oxygen, the amorphous semiconductor member is also capable of withstanding high temperatures and of having good toughness characteristics.

While for purposes of illustration several forms of this invention have been disclosed, other forms thereof may become apparent to those skilled in the art upon reference to this disclosure, and, therefore, this invention is to be limited only by the scope of the appended claims.

I claim:

1. An amorphous semiconductor member comprising an amorphous semiconductor material including a composition of a plurality of elements, at least one of which is a low atomic weight element comprising boron, carbon, nitrogen or oxygen, formed in a solid amorphous host matrix having structural configurations which have local rather than long range order and electronic configurations providing an energy gap and an electrical activation energy, and a modifier material added to said amorphous host matrix and having orbitals which interact with the amorphous host matrix and form electronic states in the energy gap which modify substantially the electronic configurations of the amorphous host matrix at room temperature and above.

2. An amorphous semiconductor member as defined in claim 1 wherein the composition of the amorphous semiconductor material of the amorphous host matrix comprises at least two of said elements of low atomic weight.

3. An amorphous semiconductor member as defined in claim 2 wherein the composition of the amorphous semiconductor material of the amorphous host matrix comprises boron and nitrogen.

4. An amorphous semiconductor member as defined in claim 2 wherein the composition of the amorphous semiconductor material of the amorphous host matrix comprises boron and carbon.

5. An amorphous semiconductor member as defined in claim 1 wherein the composition of the amorphous semiconductor material of the amorphous host matrix comprises silicon and nitrogen.

6. An amorphous semiconductor member as defined in claim 1 wherein the composition of the amorphous semiconductor material of the amorphous host matrix comprises silicon and oxygen.

7. An amorphous semiconductor member as defined in claim 1 wherein the composition of the amorphous semiconductor material of the amorphous host matrix comprises silicon and carbon.

8. An amorphous semiconductor member as defined in claim 1 wherein the composition of the amorphous semiconductor material of the amorphous host matrix comprises tellurium and oxygen.

9. An amorphous semiconductor member as defined in claim 1 wherein the amorphous host matrix comprises a transition metal.

10. An amorphous semiconductor member as defined in claim 2 wherein the modifier material added to said amorphous host matrix comprises a transition metal.

11. An amorphous semiconductor member as defined in claim 1 wherein the amorphous host matrix of the amorphous semiconductor material is normally of intrinsic-like conduction and the modifier material added to the amorphous host matrix changes the same to extrinsic-like conduction.

12. An amorphous semiconductor member as defined in claim 1 wherein the amorphous host matrix is formed and the modifier material is added by cosputtering the amorphous semiconductor material and the modifier material.

13. An amorphous semiconductor member as defined in claim 1 wherein the modifier material added to said amorphous host matrix reduces substantially the electrical activation energy thereof and, hence, increases substantially the electrical conductivity of the semiconductor member at room temperature and above.

14. An amorphous semiconductor member as defined in claim 1 wherein the modifier material added to said amorphous host matrix changes substantially the Seebeck coefficient of the semiconductor member and/or the conductivity type thereof.

15. An amorphous semiconductor member as defined in claim 1 wherein the semiconductor member is capable of withstanding high temperatures and having good toughness characteristics.

16. An amorphous semiconductor member comprising an amorphous semiconductor material which is primarily tetrahedral bonding and comprises silicon and/or germanium and which is formed in a solid amorphous host matrix having structural configurations which have local rather than long range order and electronic configurations providing an energy gap and an electrical activation energy, and a modifier material added to said amorphous matrix, and comprising a low atomic weight element including carbon and having orbitals which interact with the amorphous host matrix and form electronic states in the energy gap which modify substantially the electronic configurations of the amorphous host matrix at room temperature and above.

17. An amorphous semiconductor member as defined in claim 16 wherein the amorphous semiconductor material comprises silicon.

18. An amorphous semiconductor member as defined in claim 16 wherein the amorphous host matrix of the amorphous semiconductor material is normally of intrinsic-like conduction and the modifier material added to the amorphous host matrix changes the same to extrinsic-like conduction.

19. An amorphous semiconductor member as defined in claim 16 wherein the amorphous host matrix is formed and the modifier material is added by cosputtering the amorphous semiconductor material and the modifier material.

20. An amorphous semiconductor member as defined in claim 16 wherein the semiconductor member is capable of withstanding high temperatures and having good toughness characteristics.

21. An amorphous semiconductor member as defined in claim 16 wherein the modifier material added to said amorphous host matrix reduces substantially the electrical activation energy thereof an, hence, increases substantially the electrical conductivity of the semiconductor member at room temperature and above.

22. An amorphous semiconductor member as defined in claim 16 wherein the modifier material added to said amorphous host matrix changes substantially the Seebeck coefficient of the semiconductor member and/or the conductivity type thereof.

23. An amorphous semiconductor member comprising an amorphous semiconductor material which is primarily tetrahedral bonding and comprises silicon and/or germanium and which is formed in a solid amorphous host matrix having structural configurations which have local rather than long range order and electronic configurations providing an energy gap and an electrical activation energy, and a modifier material added to said amorphous matrix, primarily in a non-substitutional manner and can be in amounts greater than dopant amounts, and comprising a low atomic weight element including boron and having orbitals which interact with the amorphous host matrix and form electronic states in the energy gap which modify substantially the electronic configurations of the amorphous host matrix at room temperature and above.

24. An amorphous semiconductor member as defined in claim 23 wherein the amorphous semiconductor material comprises silicon.

25. An amorphous semiconductor member as defined in claim 23 wherein the amorphous host matrix of the amorphous semiconductor material is normally of intrinsic-like conduction and the modifier material added to the amorphous host matrix changes the same to extrinsic-like conduction.

26. An amorphous semiconductor member as defined in claim 23 wherein the amorphous host matrix is formed and the modifier material is added by cosputtering the amorphous semiconductor material and the modifier material.

27. An amorphous semiconductor member as defined in claim 23 wherein the semiconductor member is capable of withstanding high temperatures and having good toughness characteristics.

28. An amorphous semiconductor member as defined in claim 23 wherein the modifier material added to said amorphous host matrix reduces substantially the electrical activation energy thereof and, hence, increases substantially the electrical conductivity of the semiconductor member at room temperature and above.

29. An amorphous semiconductor member as defined in claim 23 wherein the modifier material added to said amorphous host matrix changes substantially the Seebeck coefficient of the semiconductor member and/or the conductivity type thereof.

30. An amorphous semiconductor member comprising an amorphous semiconductor material which is of low atomic weight and comprises boron and which is formed in a solid amorphous host matrix having structural configurations which have local rather than long range order and electronic configurations providing an energy gap and an electrical activation energy, and a modifier material added to said amorphous matrix, and comprising a low atomic weight element including carbon and having orbitals which interact with the amorhous host matrix and form electronic states in the energy gap which modify substantially the electronic configurations of the amorphous host matrix at room temperature and above.

31. An amorphous semiconductor member as defined in claim 30 wherein the amorphous host matrix of the amorphous semiconductor material is normally of intrinsic-like conduction and the modifier material added to the amorphous host matrix changes the same to extrinsic-like conduction.

32. An amorphous semiconductor member as defined in claim 30 wherein the amorphous host matrix is formed and the modifier material is added by cosputtering the amorphous semiconductor material and the modifier material.

33. An amorphous semiconductor member as defined in claim 30 wherein the semiconductor member is capable of withstanding high temperatures and having good toughness characteristics.

34. An amorphous semiconductor member as defined in claim 30 wherein the modifier material added to said amorphous host matrix reduces substantially the electrical activation energy thereof and, hence, increases substantially the electrical conductivity of the semiconductor member at room temperature and above.

35. An amorphous semiconductor member as defined in claim 30 wherein the modifier material added to said amorphous host matrix changes substantially the Seebeck coefficient of the semiconductor member and/or the conductivity type thereof.

36. An amorphous semiconductor member comprising an amorphous semiconductor material which is of low atomic weight and comprises carbon and which is formed in a solid amorphous host matrix having structural configurations which have local rather than long range order and electronic configurations providing an energy gap and an electrical activation energy, and a modifier material added to said amorphous matrix, and comprising a low atomic weight element including boron and having orbitals which interact with the amorphous host matrix and form electronic states in the energy gap which modify substantially the electronic configurations of the amorphous host matrix at room temperature and above.

37. An amorphous semiconductor member as defined in claim 36 wherein the amorphous host matrix of the amorphous semiconductor material is normally of intrinsic-like conduction and the modifier material added to the amorphous host matrix changes the same to extrinsic-like conduction.

38. An amorphous semiconductor member as defined in claim 36 wherein the amorphous host matrix is formed and the modifier material is added by cosputtering the amorphous semiconductor material and the modifier material.

39. An amorphous semiconductor member as defined in claim 36 wherein the semiconductor member is capable of withstanding high temperatures and having good toughness characteristics.

40. An amorphous semiconductor member as defined in claim 36 wherein the modifier material added to said amorphous host matrix reduces substantially the electrical activation energy thereof and, hence, increases substantially the electrical conductivity of the semiconductor member at room temperature and above.

41. An amorphous semiconductor member as defined in claim 36 wherein the modifier material added to said amorphous host matrix changes substantially the Seebeck coefficient of the semiconductor member and/or the conductivity type thereof.

42. An amorphous semiconductor member comprising an amorphous semiconductor material which is of low atomic weight and comprises boron and which is formed in a solid amorphous host matrix having structural configurations which have local rather than long range order and electronic configurations providing an energy gap and an electrical activation energy, and a modifier material added to said amorphous matrix and having orbitals which interact with the amorphous host matrix and form electronic states in the energy gap which modify substantially the electronic configurations of the amorphous host matrix at room temperature and above.

43. An amorphous semiconductor member as defined in claim 42 wherein the modifier material comprises a transition metal.

44. An amorphous semiconductor member as defined in claim 42 wherein the amorphous host matrix of the amorphous semiconductor material is normally of intrinsic-like conduction and the modifier material added to the amorphous host matrix changes the same to extrinsic-like conduction.

45. An amorphous semiconductor member as defined in claim 42 wherein the amorphous host matrix is formed and the modifier material is added by cosputtering the amorphous semiconductor material and the modifier material.

46. An amorphous semiconductor member as defined in claim 42 wherein the semiconductor member is capable of withstanding high temperatures and having good toughness characteristics.

47. An amorphous semiconductor member as defined in claim 42 wherein the modifier material added to said amorphous host matrix reduces substantially the electrical activation energy thereof and, hence, increases substantially the electrical conductivity of the semiconductor member at room temperature and above.

48. An amorphous semiconductor member as defined in claim 42 wherein the modifier material added to said amorphous host matrix changes substantially the Seebeck coefficient of the semiconductor member and/or the conductivity type thereof.

49. The method of making an amorphous semiconductor member comprising, forming an amorphous semiconductor material including a composition of a plurality of elements, at least one of which is a low atomic weight element comprising boron, carbon, nitrogen or oxygen, in a solid amorphous host matrix having structural configurations which have local rather than long range order and electronic configurations providing an energy gap and an electrical activation energy, and adding to said amorphous host matrix and a modifier material having orbitals which interact with the amorphous host matrix and form electronic states in the energy gap which modify substantially the electronic configurations of the amorphous host matrix at room temperature and above.

50. The method as defined in claim 49 wherein the composition of the amorphous semiconductor material of the amorphous host matrix comprises at least two of said elements of low atomic weight.

51. The method as defined in claim 50 wherein the modifier material added to said amorphous host matrix comprises a transition metal.

52. The method as defined in claim 49 wherein the modifier material added to said amorphous host matrix comprises a transition metal.

53. The method as defined in claim 49 wherein the amorphous host matrix is formed and the modifier material is added by cosputtering the amorphous semiconductor material and the modifier material.

54. The method of making an amorphous semiconductor member comprising forming an amorphous semiconductor material, which is primarily tetrahedral bonding and comprises silicon and/or germanium, in a solid amorphous host matrix having structural configurations which have local rather than long range order and electronic configurations providing an energy gap and an electrical activation energy, and adding to said amorphous host matrix a modifier material comprising a low atomic weight element including carbon and having orbitals which interact with the amorphous host matrix and form electronic states in the energy gap which modify substantially the electronic configurations of the amorphous host matrix at room temperature and above.

55. The method as defined in claim 54 wherein the amorphous host matrix is formed and the modifier material is added by cosputtering the amorphous semiconductor material and the modifier material.

56. The method as defined in claim 54 wherein the semiconductor member is capable of withstanding high 57. The method of making an amorphous semiconductor member comprising forming an amorphous semiconductor material, which is primarily tetrahedral bonding and comprises silicon and/or germanium, in a solid amorphous host matrix having structural configurations which have local rather than long range order and electronic configurations providing an energy gap and an electrical activation energy, and adding to said amorphous host matrix, primarily in a non-substitutional manner and can be in amounts greater than dopant amounts, a modifier material comprising a low atomic weight element including boron and having orbitals which interact with the amorphous host matrix and form electronic states in the energy gap which modify substantially the electronic configurations of the amorphous host matrix at room temperature and above.

58. The method as defined in claim 57 wherein the amorphous host matrix is formed and the modifier material is added by cosputtering the amorphous semiconductor material and the modifier material.

59. The method as defined in claim 57 wherein the semiconductor member is capable of withstanding high temperatures and having good toughness characteristics.

60. The method of making an amorphous semiconductor member comprising forming an amorphous semiconductor material, which comprises boron in a solid amorphous host matrix having structural configurations which have local rather than long range order and electronic configurations providing an energy gap and an electrical activation energy, and adding to said amorphous host matrix a modifier material comprising a low atomic weight element including carbon and having orbitals which interact with the amorphous host matrix and form electronic states in the energy gap which modify substantially the electronic configurations of the amorphous host matrix at room temperature and above.

61. The method as defined in claim 60 wherein the amorphous host matrix is formed and the modifier material is added by cosputtering the amorphous semiconductor material and the modifier material.

62. The method as defined in claim 60 wherein the semiconductor member is capable of withstanding high temperatures and having good toughness characteristics.

63. The method of making an amorphous semiconductor member comprising forming an amorphous semiconductor material which comprises carbon in a solid amorphous host matrix having structural configurations which have local rather than long range order and electronic configurations providing an energy gap and an electrical activation energy, and adding to said amorphous host matrix a modifier material comprising a low atomic weight element including boron and having orbitals which interact with the amorphous host matrix and form electronic states in the energy gap which modify substantially the electronic configurations of the amorphous host matrix at room temperature and above.

64. The method as defined in claim 63 wherein the amorphous host matrix is formed and the modifier material is added by cosputtering the amorphous semiconductor material and the modifier material.

65. The method as defined in claim 63 wherein the semiconductor member is capable of withstanding high temperatures and having good toughness characteristics.

66. The method of making an amorphous semiconductor member comprising forming an amorphous semiconductor material which comprises boron in a solid amorphous host matrix having structural configurations which have local rather than long range order and electronic configurations providing an energy gap and an electrical activation energy, and adding to said amorphous host matrix a modifier material having orbitals which interact with the amorphous host matrix and form electronic states in the energy gap which modify substantially the electronic configurations of the amorphous host matrix at room temperature and above.

67. The method as defined in claim 66 wherein the modifier material added to said amorphous host matrix comprises a transition metal.

68. The method as defined in claim 66 wherein the amorphous host matrix is formed and the modifier material is added by cosputtering the amorphous semiconductor material and the modifier material.

69. The method as defined in claim 66 wherein the semiconductor member is capable of withstanding high temperatures and having good toughness characteristics.

70. An amorphous semiconductor member comprising an amorphous semiconductor material which is primarily tetrahedral bonding and comprises silicon and/or germanium and which is formed in a solid amorphous host matrix having structural configurations which have local rather than long range order and electronic configurations providing an energy gap and an electrical activation energy, and a modifier material added to said amorphous matrix, and comprising a low atomic weight element including carbon or boron and having orbitals which interact with the amorphous host matrix and form electronic states in the energy gap which modify substantially the electronic configurations of the amorphous host matrix at room temperature and above.

71. An amorphous semiconductor member comprising an amorphous semiconductor material which is of low atomic weight and comprises boron or carbon and which is formed in a solid amorphous host matrix having structural configurations which have local rather than long range order and electronic configurations providing an energy gap and an electrical activation energy, and a modifier material added to said amorphous matrix, and comprising a low atomic weight element including carbon or boron, respectively, and having orbitals which interact with the amorphous host matrix and form electronic states in the energy gap which modify substantially the electronic configurations of the amorphous host matrix at room temperature and above.

72. The method of making an amorphous semiconductor member comprising forming an amorphous semiconductor material, which is primarily tetrahedral bonding and comprises silicon and/or germanium, in a solid amorphous host matrix having structural configurations which have local rather than long range order and electronic configurations providing an energy gap and an electrical activation energy, and adding to said amorphous host matrix a modifier material comprising a low atomic weight element including carbon or boron and having orbitals which interact with the amorphous host matrix and form electronic states in the energy gap which modify substantially the electronic configurations of the amorphous host matrix at room temperature and above.

73. The method of making an amorphous semiconductor member comprising forming an amorphous semiconductor material, which comprises boron or carbon in a solid amorphous host matrix having structural configurations which have local rather than long range order and electronic configurations providing an energy gap and an electrical activation energy, and adding to said amorphous host matrix a modifier material comprising a low atomic weight element including carbon or boron, respectively, and having orbitals which interact with the amorphous host matrix and form electronic states in the energy gap which modify substantially the electronic configurations of the amorphous host matrix at room temperature and above.

* * * * *